United States Patent
Gonzalez

(10) Patent No.: US 6,465,865 B1
(45) Date of Patent: *Oct. 15, 2002

(54) ISOLATED STRUCTURE AND METHOD OF FABRICATING SUCH A STRUCTURE ON A SUBSTRATE

(75) Inventor: Fernando Gonzalez, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/967,120

(22) Filed: Nov. 12, 1997

Related U.S. Application Data

(62) Division of application No. 08/583,519, filed on Jan. 5, 1996, now abandoned.

(51) Int. Cl.[7] .................. H01L 29/00; H01L 27/108; H01L 29/76; H01L 29/94; H01L 31/119
(52) U.S. Cl. .................. 257/506; 257/510; 257/306
(58) Field of Search .................. 257/506–510, 257/513, 520, 514, 515, 516, 622, 296–310; 438/426–434, 362, 222, 404–410, 438, 509–510, 234, 355, FOR 222

(56) References Cited

U.S. PATENT DOCUMENTS

| | | | |
|---|---|---|---|
| 4,222,792 A | 9/1980 | Lever et al. | 148/1.5 |
| 4,361,600 A | 11/1982 | Brown | 427/93 |
| 4,407,851 A | 10/1983 | Kurosawa et al. | 427/39 |
| 4,551,743 A | * 11/1985 | Murakami | 257/513 |
| 4,604,162 A | 8/1986 | Sobczak | 156/657 |
| 4,615,746 A | 10/1986 | Kawakita et al. | 148/1.5 |
| 4,689,872 A | * 9/1987 | Appels et al. | 438/362 |
| 4,735,821 A | 4/1988 | Yamazaki et al. | 427/54.1 |
| 4,814,287 A | 3/1989 | Takemoto et al. | 437/62 |
| 4,845,048 A | 7/1989 | Tamaki et al. | 437/62 |
| 4,974,060 A | * 11/1990 | Ogasawara | 257/302 |
| 5,084,130 A | 1/1992 | Yamazaki et al. | 156/643 |
| 5,176,789 A | 1/1993 | Yamazaki et al. | 156/643 |
| 5,214,603 A | 5/1993 | Dhong et al. | 365/207 |
| 5,331,197 A | * 7/1994 | Miyawaki et al. | 257/530 |
| 5,336,629 A | 8/1994 | Dhong et al. | 437/52 |
| 5,453,396 A | 9/1995 | Gonzalez et al. | 437/69 |
| 5,629,539 A | * 5/1997 | Aoki et al. | 257/303 |

FOREIGN PATENT DOCUMENTS

| | | | | |
|---|---|---|---|---|
| JP | 57-154855 | 9/1982 | | |
| JP | 357154856 A | * 9/1982 | | 257/506 |
| JP | 59-232437 | 12/1984 | | |
| JP | 60-74452 | 4/1985 | | |
| JP | 61-201444 | 9/1986 | | |
| JP | 2-222160 | 9/1990 | | |
| JP | 3-89532 | 4/1991 | | |
| JP | 404302892 A | 10/1992 | | |

* cited by examiner

Primary Examiner—Tom Thomas
Assistant Examiner—Cuong Quang Nguyen
(74) Attorney, Agent, or Firm—Thorp, Reed & Armstrong LLP

(57) ABSTRACT

A method of forming an isolated structure of sufficient size to permit the fabrication of an active device thereon is comprised of the steps of depositing a gate oxide layer on a substrate. Material, such as a polysilicon layer and a nitride layer, is deposited on the gate oxide layer to protect the gate oxide layer. An active area is defined, typically by patterning a layer of photoresist. The protective material, the layer of oxide, and finally the substrate are etched to form a trench around the active area. Spacers are formed on the sides of the active area. The substrate is etched to deepen the trench around the active area to a point below the spacers. The substrate is oxidized at the bottom of the trench and horizontally under the active area to at least partially isolate the active area from the substrate. The protective material and the spacers are removed and the trench is filled with an oxide.

10 Claims, 4 Drawing Sheets

ISOLATED STRUCTURE AND METHOD OF FABRICATING SUCH A STRUCTURE ON A SUBSTRATE

This is a divisional of application Ser. No. 08/583,519 filed, on Jan. 5, 1996, now abandoned

BACKGROUND OF THE INVENTION

1. Field of the Invention

The present invention is directed to techniques for fabricating solid state memories and, more particularly, to techniques used in the fabrication of ultra-dense solid state memories.

2. Description of the Background

Techniques for fabricating solid state memories have been commercially available for many years. During that time, there has been, and continues to be, pressure to shrink the size of the individual memory cell so that memories of larger and larger capacity can be fabricated. That pressure has lead to the development of unique components. For example, the trench capacitor and stacked capacitor have been developed. Those components are three-dimensional structures. By fabricating the capacitors in an upward direction, less planar surface of the chip is used thereby permitting a more dense circuit architecture. In such three dimensional components, the edge or vertical portion of the component plays an important role in determining the component's characteristics.

New fabrication techniques must often be developed to enable such unique components to be realized. Preferably, the techniques needed to fabricate such components are developed in such a manner that a manufacturer's existing fabrication equipment can be used so that the expense of purchasing costly new equipment can be avoided, or at least postponed.

The pressure to continually fit more memory cells into a given amount of space has also lead to new circuit architectures. For example, U.S. Pat. No. 5,214,603 discloses a folded bitline, dynamic random access memory cell which utilizes a trench capacitor and a planar-configured access transistor that is stacked over the capacitor.

As components become smaller and are packed closer together, leakage and second order effects become more and more significant. Current circuit architectures fabricated with commercially available techniques, while very capable of producing dense memories, are not capable of being scaled down to the levels needed to produce ultra-dense memories on the order of 256 megabits and higher. Thus, the need exists for a method and circuit architecture for enabling active devices to be fabricated in such a manner that the active devices can be packed in an ultra-dense manner using currently available fabrication equipment.

SUMMARY OF THE INVENTION

The present invention is directed to a method of forming a partially isolated structure of sufficient size to permit the fabrication of an active device thereon. The method is comprised of the steps of depositing a gate oxide layer on a substrate. Material, such as a polysilicon layer and a nitride layer, is deposited on the gate oxide layer to protect the gate oxide layer. An active area is defined, typically by patterning a layer of photoresist. The protective material, the layer of oxide, and finally the substrate are etched to form a trench around the active area. Spacers are formed on the sides of the active area. The substrate is etched to deepen the trench around the active area to a point below the spacers. The substrate is oxidized at the bottom of the trench and horizontally under the active area to partially or completely isolate the active area from the substrate. The protective material and the spacers are removed and the trench is filled with an oxide.

The present invention is also directed to an isolated structure of sufficient size to permit the fabrication of an active device thereon. The structure is comprised of a substrate and a layer of gate oxide carried by the substrate in a manner which defines the area of the isolated structure. The substrate is oxidized under all or a portion of the area defined by the gate oxide at a depth sufficient to enable an active device to be fabricated in an unoxidized portion of the substrate occurring between the gate oxide layer and the oxidized portion of the substrate.

The method and apparatus of the present invention enable active devices to be packed into ultra-dense configurations using currently available fabrication equipment. For example, the present invention may be used to implement 256 megabit or 1 gigabit memories. Additionally, because the diode junctions of active devices are formed in areas of the substrate that are at least partially isolated from the remainder of the substrate, the junctions are less leaky. Also, the configuration of the field oxide provides excellent device to device isolation. Those, and other advantages and benefits of the present invention will become apparent from the Description Of The Preferred Embodiment hereinbelow.

BRIEF DESCRIPTION OF THE DRAWINGS

For the present invention to be clearly understood and readily practiced, the present invention will be described in conjunction with the following figures wherein:

FIG. 2a illustrates a portion of a substrate having an active area island defined on a layer of nitride over a layer of polysilicon over a layer of oxide;

FIG. 2b is a top view looking down onto the portion of the substrate shown in FIG. 2a;

FIG. 7b is a top view looking down onto the portion of the substrate shown in FIG. 7a;

DESCRIPTION OF THE PREFERRED EMBODIMENTS

Figure 1:
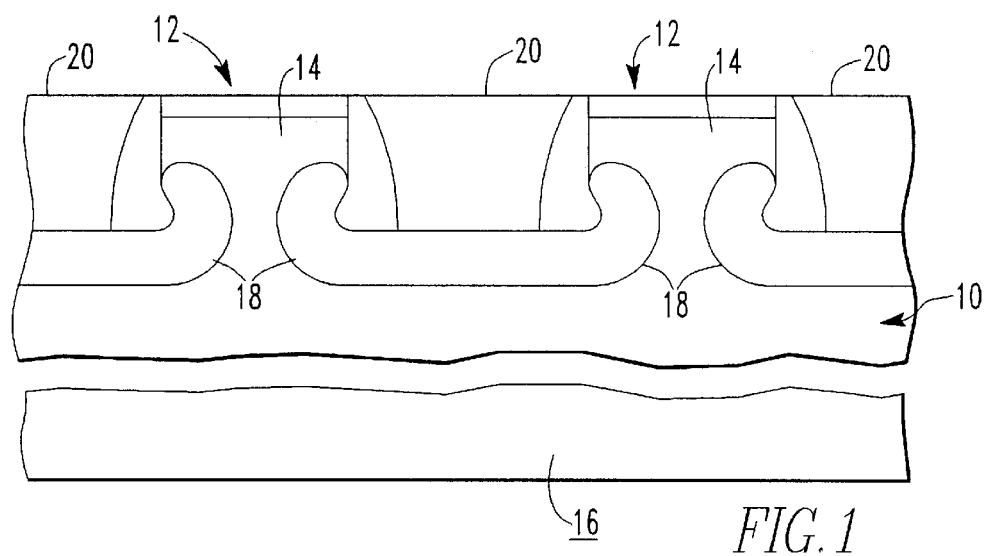
FIG. 1 illustrates a substrate carrying a plurality of partially isolated structures separated by field oxide regions in accordance with the teachings of the present invention.

The present invention, as illustrated in FIG. 1, is comprised of a substrate 10 carrying a plurality of isolated structures 12. The structures 12 are referred to as partially isolated structures because they are comprised of virgin substrate material 14, e.g. silicon, which is partially isolated from the bulk of the substrate material 16 by oxidized regions 18. The partially isolated structures 12 are of a minimum feature size for a typical 256 megabit DRAM technology, for example, 0.25 microns by 0.25 microns by 0.15 microns in depth. Partially isolated structures 12 are isolated from one another by field oxide regions 20. The PN junctions of active devices formed in virgin substrate material 14 will be less leaky because the virgin substrate material 14 is substantially electrically isolated from the bulk of the substrate 16 by virtue of the oxidized regions 18. Also, devices can be fabricated closer together while still providing acceptable operational devices. It should be noted that if the dimensions are sufficiently small, then the structures 12 may become completely isolated. Structures of various sizes may be provided such that some are completely isolated while others are partially isolated. The process for fabricating a substrate 10 of the type illustrated in FIG. 1 will now be described.

Figures 2A, 2B:
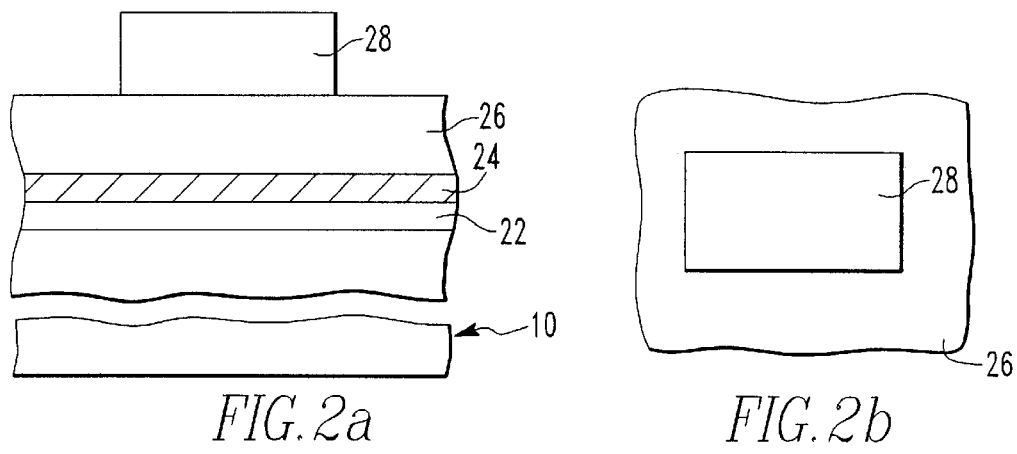

Turning to FIGS. 2a and 2b, the virgin substrate material 10 has a layer of oxide 22 deposited thereon. As used herein, the term deposited is used broadly to mean layers which are not only deposited in the traditional sense, but layers of material which are grown or in any other manner caused to be formed. A layer of polysilicon 24 is deposited on top of the oxide layer 22 and a nitride layer 26 is deposited on top of the polysilicon layer 24. The layers 24 and 26 may be thought of as material which is provided to protect the oxide layer 22.

A layer of photoresist is deposited on top of the nitride layer 26 and thereafter patterned to leave areas 28 of the photoresist layer on nitride layer 26 as seen best in FIG. 2b. The areas protected by the remnants 28 of the photoresist layer define the planer dimensions, i.e. the x and y dimensions, of what will become the isolated structure 12.

Figures 3, 4:
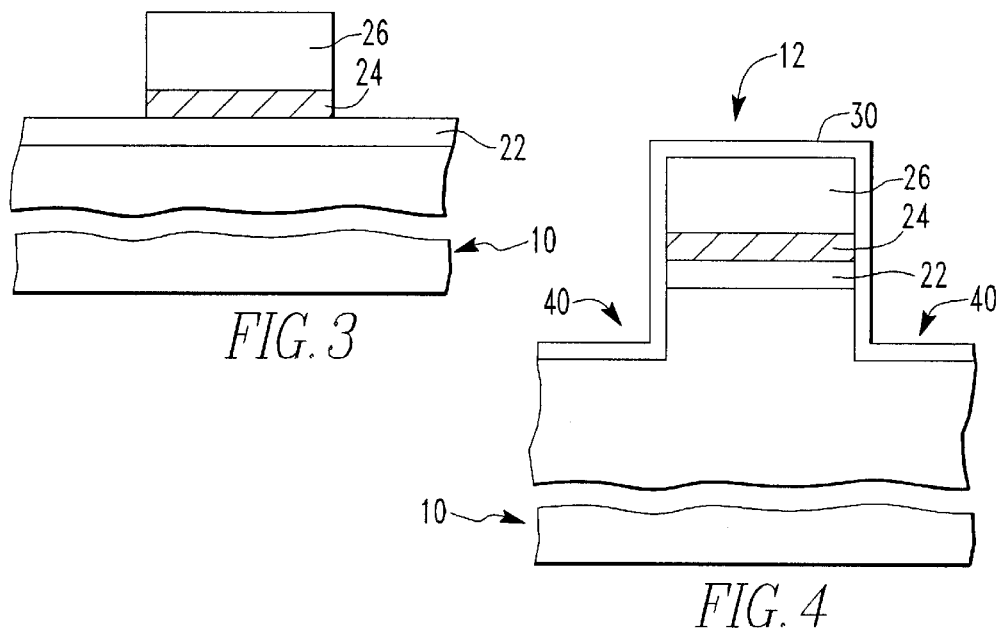
FIG. 3 illustrates the substrate of FIG. 2 etched to the oxide layer and with the photoresist stripped.
FIG. 4 illustrates the substrate of FIG. 3 with the silicon trenched and a nitride layer deposited thereon.

In FIG. 3, the nitride layer 26 and polysilicon layer 24 have been etched to the oxide layer 22. Also, the photoresist 28 has been stripped.

In FIG. 4, the oxide layer 22 is etched as well as the substrate 10 so as to form a trench 40 completely surrounding the material which will form the partially isolated structure 12. Thereafter, a nitride layer 30 is deposited.

Figure 5:
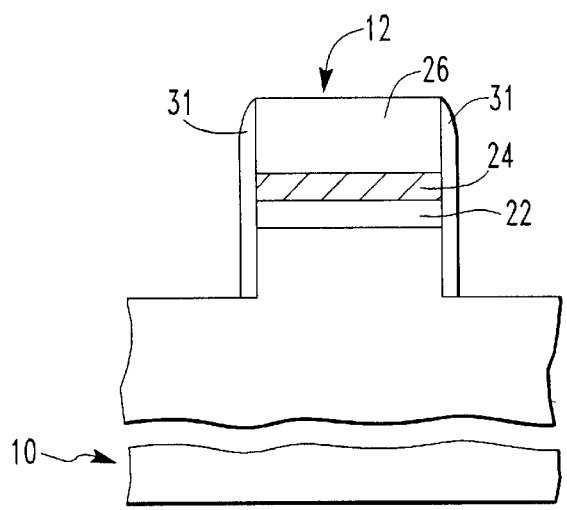
FIG. 5 illustrates the manner in which the nitride layer is etched to create nitride spacers.
Figure 6:
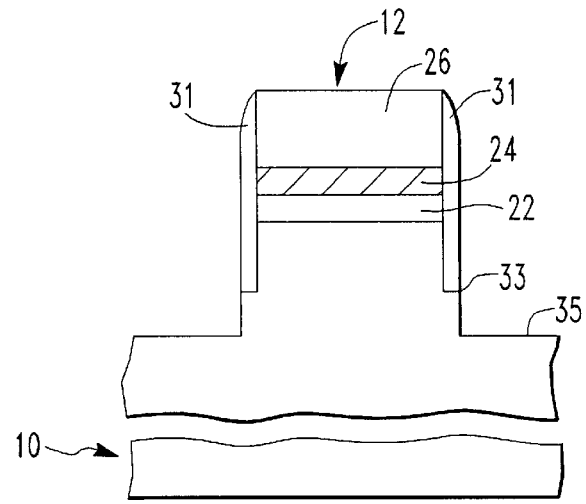
FIG. 6 illustrates the substrate of FIG. 5 wherein the substrate is etched again to a level below the nitride spacers.

Turning to FIG. 5, the nitride layer 30 is etched so that all that remains of the nitride layer 30 is a nitride spacer 31. The reader will recognize that the nitride spacer 31 completely surrounds the area which will become the partially isolated structure 12. Thereafter, the substrate is further etched to deepen the trench 40 to a level below the nitride spacer 31. When the substrate is etched again, the nitride spacer 31 is left supported by a ledge 33 formed in the substrate 10. As shown in FIG. 6, the nitride spacer 31 may have a height on the order of 0.25 microns whereas the distance from the ledge 33 to the bottom 35 of the trench may be on the order of 0.10 to 0.3 microns.

Figure 7A:
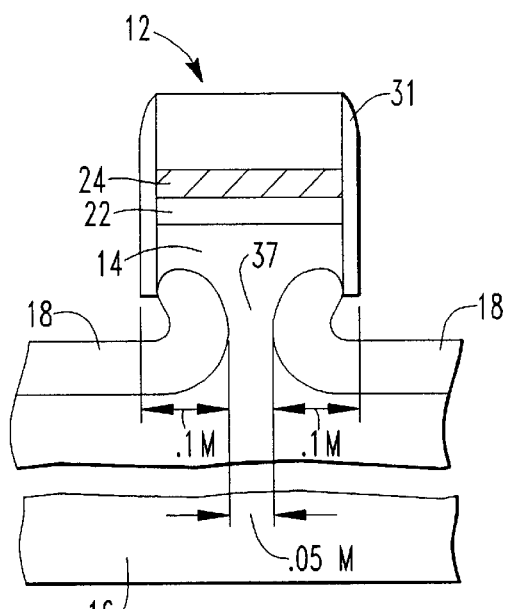
FIG. 7a illustrates the substrate of FIG. 6 with the exposed vertical silicon being oxidized into the area under the active area and horizontally in the field regions.
Figure 7B:
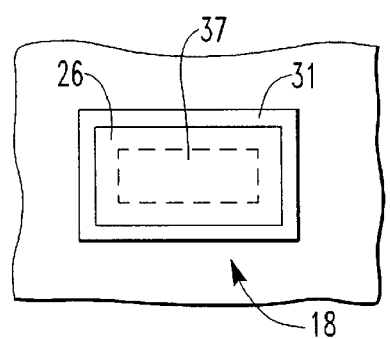

The exposed substrate is then oxidized, preferably using conventional thermal oxidation techniques, as shown in FIGS. 7a and 7b. The oxidation consumes silicon downward into the substrate, sideways underneath the region which will become the partially isolated structure 12, and upward into the virgin substrate material 14. That oxidation step, which may be referred to as a minifield oxidation step, is precisely controlled to control the amount of virgin substrate material 141 that is consumed. A sufficient volume of virgin substrate material 14 should remain to enable fabrication of active devices. As shown in FIG. 7a, the amount of substrate consumed horizontally may, for example, be approximately 0.1 micron on each side of the area 12. That oxidation process leaves a stem 37 connecting the virgin substrate material 14 to the bulk of the substrate 1.6. The stem is on the order of 0.05 microns by 0.05 microns. It is the minifield oxidation step which causes the virgin substrate material 14 to be partially isolated such that the structure 12 becomes a partially isolated structure. The stem 37 and substrate consumed by the oxidation process under the partially isolated structure 12 may also be seen in FIG. 7b. Oxidation time will depend upon the area of the partially isolated structure 12 and the other parameters. Typical oxidation parameters are as follows: 850°–1100° C., wet ambient or dry $O_2$, and high pressure or atmospheric. We prefer 850° C. at high pressure with wet ambient for a sufficient time to allow 0.1 micron horizonal oxidation under partially isolated areas 12 and 0.1 vertical oxidation in the partially isolated areas 12. With a 0.25 micron spacer, the partially isolated areas 12 will be left with an area of virgin substrate material 14 approximately 0.15 microns in depth.

Figure 8:
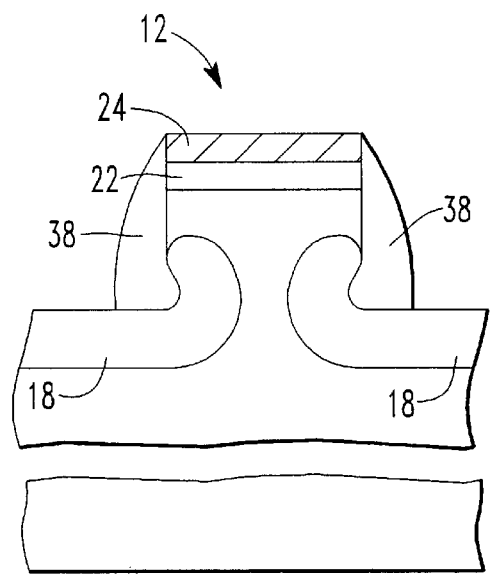
FIG. 8 illustrates the substrate of FIG. 7a with the nitride layer removed and the nitride spacers removed and replaced with oxide spacers.

Turning now to FIG. 8, after the minifield oxidation step, the remainder of the nitride layer 26 and the nitride spacers 31 are removed by, for example, a wet etch. The oxidized regions 18 are somewhat curved at the bottom of the partially isolated structure 12. It is desirable to insure that that curved portion is completely filled in. For that reason, a layer of TeOS oxide is deposited in a manner so as to fill in the curved portion under the partially isolated structure 12. Thereafter, the TeOS layer is etched so that an oxide spacer 38 is left surrounding the partially isolated structure 12.

Figure 9:
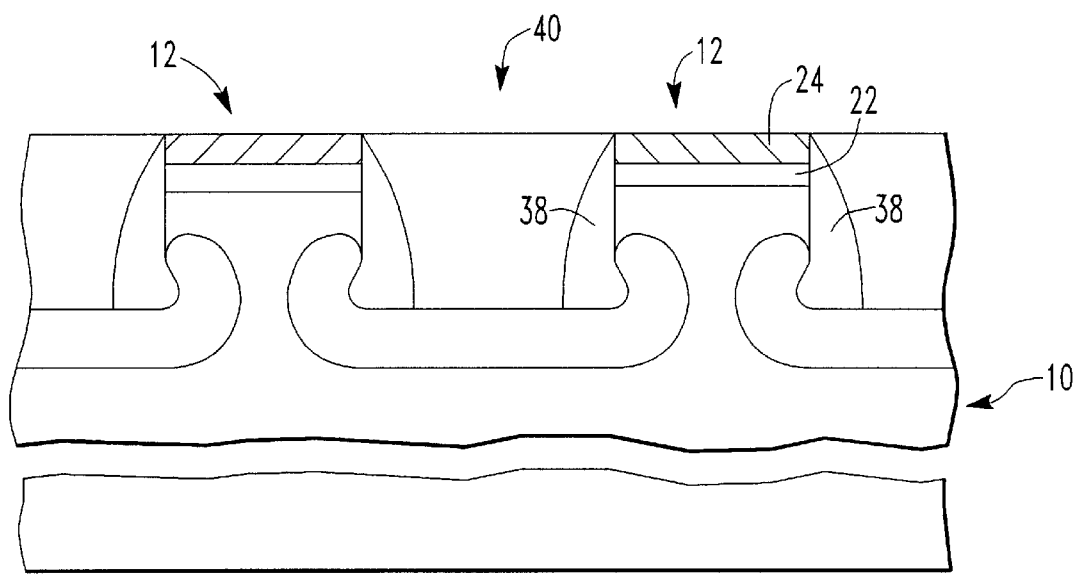
FIG. 9 illustrates a larger area of the substrate of FIG. 8 so that adjacent structures may be seen and wherein the trench separating adjacent structures is filled by oxide.

In FIG. 9, a larger portion of the substrate is illustrated so that adjacent partially isolated structures 12 may be seen. The partially isolated structures 12 are separated by the trench 40. At this point, the substrate 10 is subjected to an oxide deposition which blankets the substrate 10 filling in the trench 40. Thereafter, the oxide is etched by a process which stops when the polysilicon layer 24 is reached. There may be a small amount of overetching of the oxide in the area of the trench 40 such that the level of the oxide is slightly lower than the top surface of the polysilicon layer 24.

Figure 10:
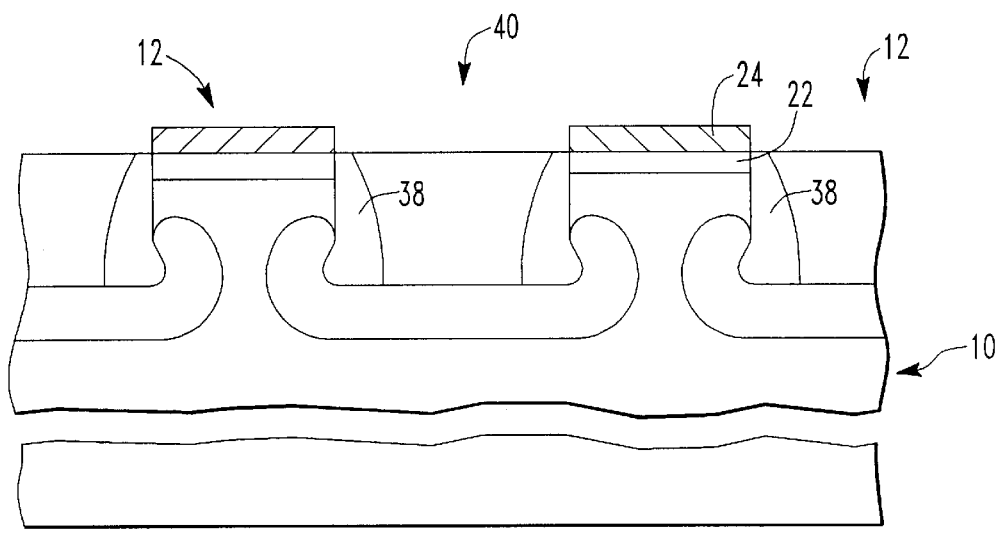
FIG. 10 illustrates the substrate of FIG. 9 wherein the oxide fill is etched to about the level of the surface of the silicon.

Turning to FIG. 10, the oxide filling the trench 40 is etched so that the top surface of the oxide in the trench 40 is approximately even with the top surface of the oxide layer 22. Thereafter, the remnants of the polysilicon layer 24 are stripped in a manner so as not to damage the remnants of the oxide layer 22 which results in the structure illustrated in FIG. 1. The remnants of the oxide layer 22 can be used as gate oxide for the fabrication of active devices. Active devices fabricated in partially isolated structure 12 are separated from one another by the field oxide regions 20. The field oxide regions are dimensioned so that partially isolated structure 12 are approximately 0.25 microns from each other. Total isolation between devices on the active areas 12 can be, as much as 0.65 microns (0.2 microns, plus 0.25 microns, plus 0.2 microns) for a given 0.25 active area spacing. Furthermore, the field oxide regions are comprised of both thermal oxide and deposited oxide so that the advantages of each type of oxide can be gained.

Figure 11:
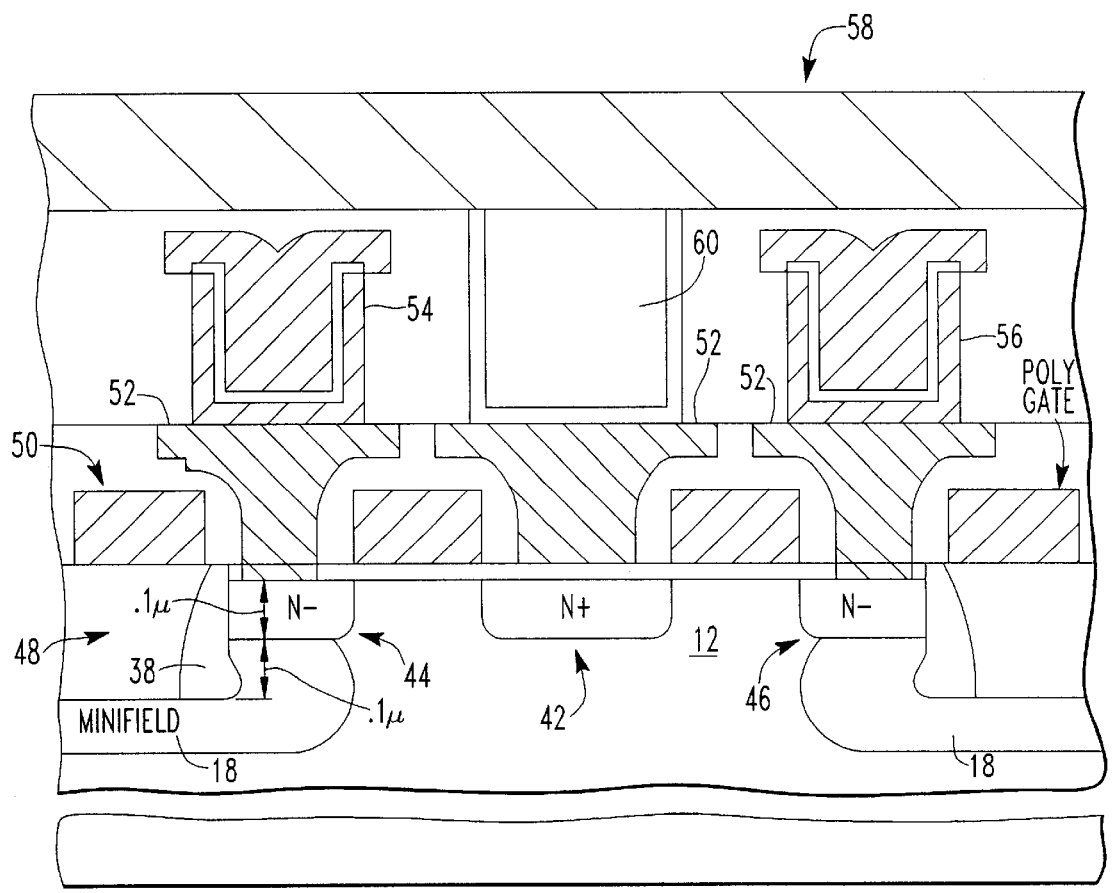
FIG. 11 illustrates a memory cell fabricated on the substrate illustrated in FIG. 10.

A portion of the substrate shown in FIG. 1 is also shown in FIG. 11 with two memory cells formed thereon. Active devices in the form of a digitline junction 42 and storage node junctions 44, 46 are formed in partially isolated structure 12. A wordline 50 overlays the oxide 48 which fills trench 40. Storage node junctions 44, 46 are in electrical contact with capacitors 54, 56, respectively, through polyplugs 52. The digitline junction 42 is in electrical contact with a metal digitline 58 through a polyplug 52 and a metal plug 60.

A substrate 10 carrying a plurality of partially isolated structures 12 provides an excellent vehicle for the fabrication of solid state memories such as an SRAM, DRAM, other types of memory, or virtually any type of logic circuit. When used for the fabrication of memories, it is anticipated that the storage node junction for the capacitor will be fabricated in the partially isolated structure 12 as shown in FIG. 11.

While FIG. 11 illustrates one type of device which might be fabricated upon substrate 10, those of ordinary skill in the art will recognize the advantages of fabricating other types of devices. In particular, active devices formed in partially isolated structures 12 will be substantially isolated from the bulk of the substrate 16 thereby eliminating or substantially reducing leakage in those areas.

While the present invention has been described in connection with a preferred embodiment thereof, those of ordinary skill in the art will recognize that many modifications and variations may be employed. For example, the sample dimensions and process parameters disclosed herein may be varied and are disclosed for the purpose of illustration and not limitation. The foregoing disclosure and the following claims are intended to cover all such modifications and variations.

What is claimed is:

1. A structure, comprising:

a substrate;

a layer of deposited oxide carried by said substrate and defining an area of the substrate which forms the partially isolated structure, said structure having several sides and a top;

a deposited oxide spacer positioned around the partially isolated structure and in contact with the partially isolated structure and said layer of oxide;

a thermally oxidized layer of substrate positioned below said oxide layer, said spacer, and a portion of each side of the partially isolated structure such that the partially isolated structure is connected by a stem of unoxidized material to said substrate, said thermally oxidized layer being at a depth sufficient to enable an active device to be fabricated in the partially isolated structure; and at least one PN junction fabricated only at the top of said structure.

2. The partially isolated structure of claim 1 wherein said stem is on the order of 0.05 microns by 0.05 microns.

3. A substrate carrying a plurality of partially isolated structures, comprising:

a substrate;

a layer of deposited oxide carried by said substrate so as to define areas of the substrate which form a plurality of partially isolated structures, each structure having a plurality of sides and a top;

a plurality of deposited oxide spacers, each positioned around one of said plurality of partially isolated structures and in contact with said partially isolated structure and said layer of oxide;

a thermally oxidized layer of substrate positioned below said oxide layer, said plurality of spacers, and a portion of each of the sides of each of said plurality of partially isolated structures such that each of said partially isolated structures is connected by a stem of unoxidized material to said substrate, said thermally oxidized layer being at a depth sufficient to enable active devices to be fabricated in the partially isolated structures; and at least one PN junction fabricated only at the top of said partially isolated structures.

4. The substrate of claim 3 wherein each of said stems is on the order of 0.05 microns by 0.05 microns.

5. The substrate of claim 3 wherein said isolated structures are linearly spaced approximately 0.25 microns apart and are electrically isolated by approximately 0.65 microns.

6. The substrate of claim 3 additionally comprising a plurality of memory cells formed said plurality of partially isolated structures.

7. A structure, comprising:

a substrate comprised of regions of virgin substrate material connected to a bulk of substrate material by stems of virgin substrate material;

a layer of thermally oxidized substrate material positioned between and surrounding said stems of virgin material;

a plurality of deposited oxide spacers, each positioned on top of said layer of thermally oxidized substrate material and around and in contact with one of said regions of virgin substrate material; and a layer of deposited oxide on top of said layer of thermally oxidized substrate and between and in contact with said spacers; and at least one PN junction fabricated only at the top of said regions of virgin substrate material.

8. The structure of claim 7 wherein each said stem is on the order of 0.05 microns by 0.05 microns.

9. The structure of claim 7 wherein said regions of virgin substrate are linearly spaced approximately 0.25 microns apart and are electrically isolated by approximately 0.65 microns.

10. The structure of claim 7 wherein said oxide spacers are comprised of TeOS oxide.

* * * * *

UNITED STATES PATENT AND TRADEMARK OFFICE
CERTIFICATE OF CORRECTION

PATENT NO.    : 6,465,865 B1
DATED         : October 15, 2002
INVENTOR(S)   : Gonzalez It is certified that error appears in the above-identified patent and that said Letters Patent is hereby corrected as shown below:

Column 4,
Line 3, delete "141" and insert therefore -- 14 --.
Line 9, delete "1.6." and insert therefore -- 16. --.

Column 5,
Line 38, delete "the" second occurrence and insert therefore -- a --.

Column 6,
Line 28, after "formed" and insert therefore -- in --.

Signed and Sealed this

Twenty-ninth Day of March, 2005

JON W. DUDAS
*Director of the United States Patent and Trademark Office*